United States Patent
Kultran

(10) Patent No.: US 9,866,780 B1
(45) Date of Patent: Jan. 9, 2018

(54) PIXEL INFORMATION RECOVERY BY OVERSAMPLING A COMPARISON OF PIXEL DATA AND A NOISE SIGNAL

(71) Applicant: Northrop Grumman Systems Corporation, Falls Church, VA (US)

(72) Inventor: Denpol Kultran, Hawthorne, CA (US)

(73) Assignee: Northrop Grumman Systems Corporation, Falls Church, VA (US)

(*) Notice: Subject to any disclaimer, the term of this patent is extended or adjusted under 35 U.S.C. 154(b) by 0 days.

(21) Appl. No.: 15/353,936

(22) Filed: Nov. 17, 2016

(51) Int. Cl.
  H04N 5/378 (2011.01)
  H04N 5/376 (2011.01)
  H04N 5/361 (2011.01)

(52) U.S. Cl.
  CPC .......... *H04N 5/378* (2013.01); *H04N 5/3765* (2013.01); *H04N 5/361* (2013.01)

(58) Field of Classification Search
  CPC ....... H04N 5/378; H04N 5/3765; H04N 5/361
  See application file for complete search history.

(56) References Cited

U.S. PATENT DOCUMENTS

| 4,034,367 A | 7/1977 | Sugiyama et al. | |
| 5,128,753 A * | 7/1992 | Lemelson | B07C 5/10 348/92 |
| 5,659,315 A * | 8/1997 | Mandl | H04N 5/335 341/141 |
| 7,088,279 B2 | 8/2006 | Muramatsu et al. | |
| 2016/0323524 A1* | 11/2016 | Smith | H04N 5/23245 |

FOREIGN PATENT DOCUMENTS

WO  2014082660  6/2014

OTHER PUBLICATIONS

Jiang, D. et al; The design of high dynamic range ROIC for IRFPAs; In Applied Optics and Photonics China (AOPC2015), pp. 96740P-1 through 96740P-7; International Society for Optics and Photonics, 2015.
Ceylan, O. et al; Implementation of pixel level digital TDI for scanning type LWIR FPAs; In SPIE Defense+ Security; pp. 907025-1 through 907025-7; International Society for Optics and Photonics, 2014.
Yang, J. H. et al; A Noise-Immune High-Speed Readout Circuit for In-Cell Touch Screen Panels; In IEEE Transactions on Circuits and Systems I: Regular Papers, vol. 60, No. 7, pp. 1800-1809; Jul. 2013.
Tyrell, B. et al; Time Delay Integration and In-Pixel Spatiotemporal Filtering Using a Nanoscale Digital CMOS Focal Plane Readout; In IEEE Transactions on Electron Devices, vol. 56, No. 11, pp. 2516-2523, Nov. 2009.

* cited by examiner

*Primary Examiner* — Tuan Ho
(74) *Attorney, Agent, or Firm* — Patti & Malvone Law Group, LLC

(57) ABSTRACT

An exemplary electronic light processing cell uses a photo sensor unit to provide an analog electrical output proportional to an amount of light impinging on the photo sensor. A noise source provides a noise output that is compared by a comparator, during a plurality of times during a frame of an image, with the analog electrical output to generate a binary digital output representative of each comparison. A digital counter counts the binary digital outputs during the frame and stores a count at the end of a frame where the value of the stored count is proportional the light impinging the photo sensor. The value of the stored count is adapted for use by an image processing unit to render an image.

15 Claims, 3 Drawing Sheets

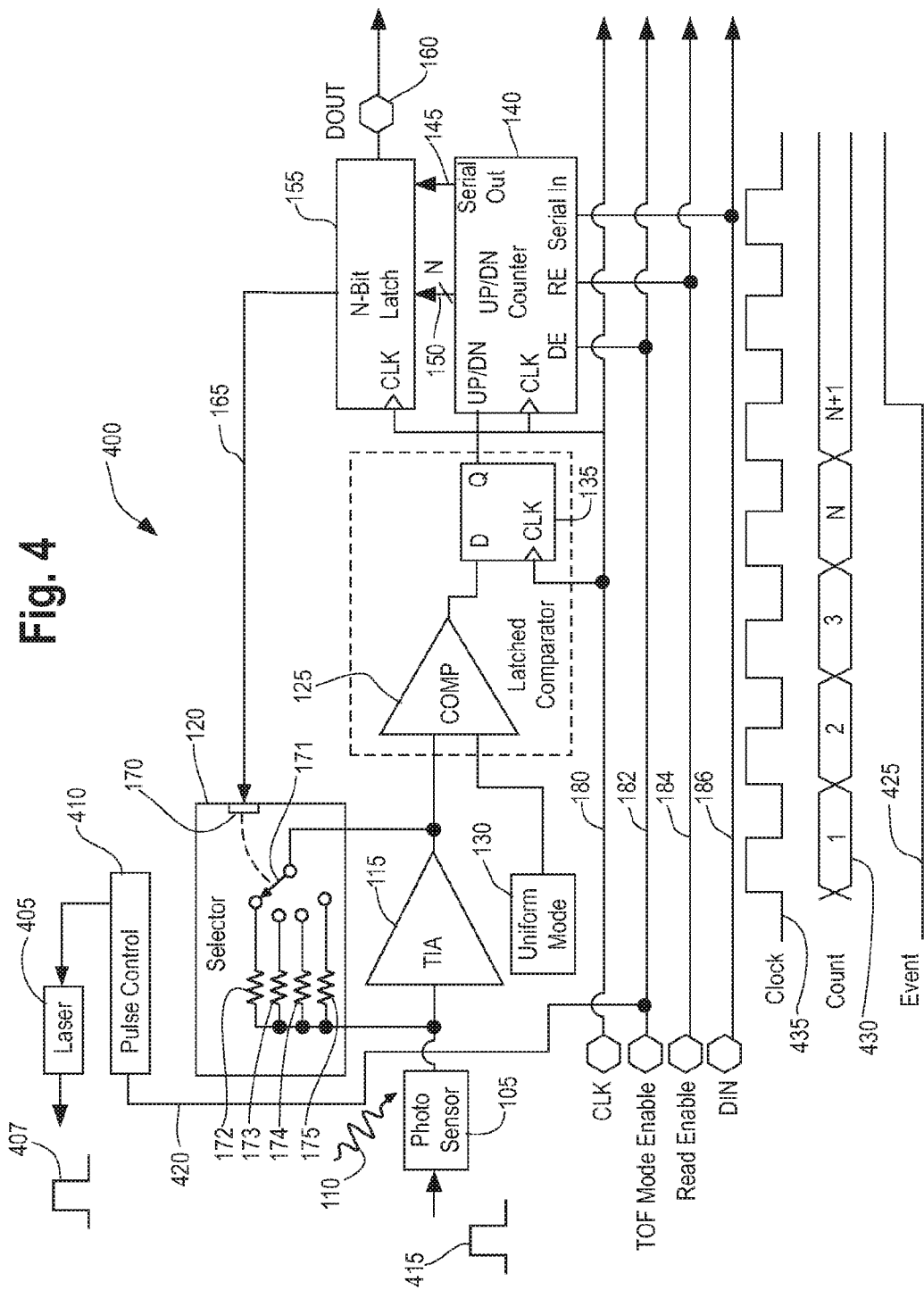

# PIXEL INFORMATION RECOVERY BY OVERSAMPLING A COMPARISON OF PIXEL DATA AND A NOISE SIGNAL

BACKGROUND

This invention relates to the recovery of output or event detection from individual pixel sites and more specifically relates to a technique that digitizes analog voltage from the unit cell. In one embodiment a capacitor at the unit cell is not required.

A common technique to digitize an analog current output from each photo detector in an array uses a capacitor to integrate the current output into a proportional voltage level which is then converted into digital signal by an analog to digital converter. As pitches, i.e. the distance between adjacent photo detectors, in large arrays gets smaller to achieve increasing finer image resolution, the smaller resulting area available for the capacitors may lead to the use of capacitors with smaller capacitance values. This may degrade the dynamic range and performance of the processing of the photo detector output. Thus, there exists a need to be able to accommodate increasingly dense photo detector arrays and the associated area restrictions per cell site.

SUMMARY

It is an object of the present invention to satisfy this need.

An exemplary electronic light processing cell uses a photo sensor unit to provide an analog electrical output proportional to an amount of light impinging on the photo sensor. A noise source provides a noise output that is compared by a comparator, during a plurality of times during a frame of an image, with the analog electrical output to generate a binary digital output representative of each comparison. A digital counter counts the binary digital outputs during the frame and stores a count at the end of a frame where the value of the stored count is proportional the light impinging the photo sensor. The value of the stored count is adapted for use by an image processing unit to render an image.

Another embodiment of the present invention includes an exemplary method for carrying out the steps generally described in the above embodiment.

DESCRIPTION OF THE DRAWINGS

Features of exemplary implementations of the invention will become apparent from the description, the claims, and the accompanying drawings in which:

FIG. 4 is a block diagram of another exemplary embodiment that is similar to the embodiment of FIG. 1.

DETAILED DESCRIPTION

Figure 1:
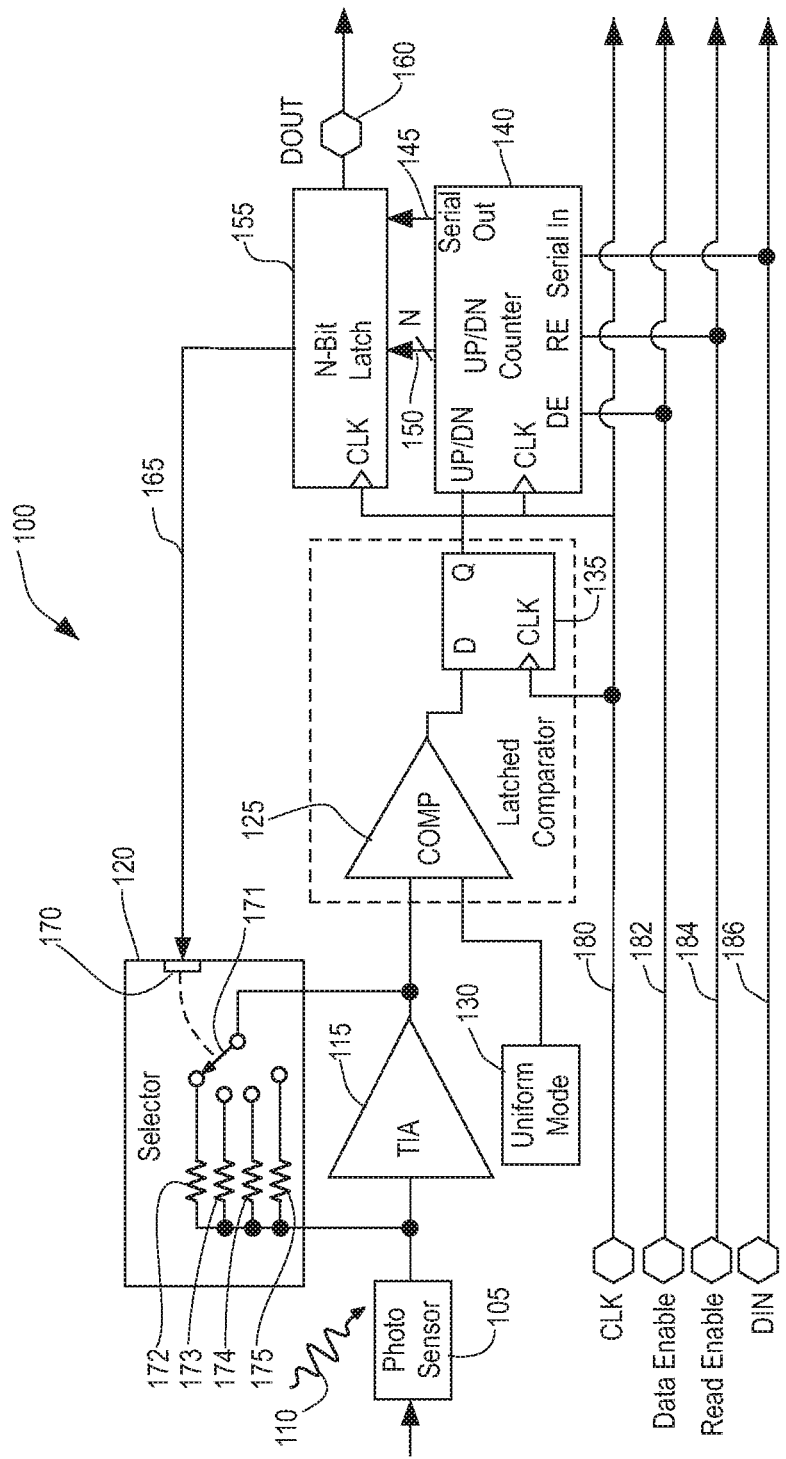
FIG. 1 is a block diagram of an exemplary embodiment of a cell in a photo detector array of the present invention.

One aspect of the present invention resides in the recognition of the difficulties associated with accommodating the increasingly smaller area available for each cell in an array of photo detectors and originating a different approach that eliminates the requirement of using a capacitor and an A/D converter at each cell site in order to remove impediments to reducing the total area required at each cell.

After generally identifying the exemplary circuitry and the interrelationship of the elements, the operation of the circuitry will then be explained. An exemplary pixel sensor 105 provides an output current that is proportional to the amount of light 110 impacting it. A transimpedance amplifier 115 converts the output current from the pixel sensor 105 into a corresponding proportional voltage output that is coupled to one input of comparator 125. The other input of comparator 125 receives a uniform uncorrelated noise voltage that has a magnitude smaller than the smallest sensor analog voltage desired for detection and a frequency that is an Over-Sampling Ratio (OSR) times faster than the frame rate desired, e.g. OSR of 4096-16,384. The output of the comparator 125 is connected to the data (D) input of the clocked flip-flop 135. The output (Q) of flip-flop 135 is coupled to the up/down count input of up/down counter 140. A serial output 145 from the counter 140 is coupled through latch 155 to a data output (Dout) 160. Another output 150 from the counter 140 that contains only a portion of the most significant bits of the count held by the counter 140 is coupled to the latch 155 which holds this value for use as part of an automatic gain control (AGC) for the amplifier 115. This latched digital value is coupled via line 165 to the control input 170 of selector 120 which selects one of different valued resistors 172, 173, 174 and 175 to connect across amplifier 115. The different value resistors determine correspondingly different levels of amplification for amplifier 115. The following inputs/lines are used as will be described below: clock 180, data enable 182, read enable 184 and data in 186.

The voltage level variations from the noise source 130 are selected to have a magnitude and frequency as described above. The objective is to have sufficient degree of oversampling so that the cumulative average value contributed by the noise signal is substantially zero to the Q output count from the flip-flop 135. The up/down count accumulated and stored in the counter 140 at the end of a frame of clock signals will be proportional to the output of photo sensor 105. The counter increments if a logic 1 is at its input, i.e. when the amplified photo sensor output is greater than noise level. The counter 140 may be of any desired bit length depending on sample rate and resolution desired, for example, 8-12 bits. The counter, at the end of a frame, will hold a binary number representative of the output of the corresponding photo sensor 105. Data enable 182 and read enable 184 are used by the counter 140 (and other counters in other cells) to enable data to be written to or read from the counter 140. Data in (Din) 186 is used to carry digital data to the counter(s). It may carry the stored data output from one counter in a serial chain of cells to the next counter in the chain in order to serially transfer the output from each counter at the end of a frame to a memory of a processing unit that will further process the data from the photo sensors to create a resulting final image. If another type photo sensor is used, the amplifier 115 might not be required if sufficient voltage range is available directly from the sensor for the operation of the comparator 125.

AGC of the output level from amplifier 115 is provided. The latch 155 receives a number R of the most significant bits (msb) from counter 140 via input 150, e.g. R=2 msb. This R binary number is interpreted by selector 120 to select one of S possible different resistor values which determines the gain of the amplifier 115, e.g. S=4. This enables the gain of the amplifier to be decreased in proportion to the value of the R bit number by selecting decreasing values of resistance in the feedback loop around amplifier 115 as the R number increases, e.g. the R number can increase from 0 (normal or no reduction in gain), to 1, to 2, and finally to 3 (assuming a 2 bit R number). An R value of "0" indicates that the count has not yet reached a magnitude to have changed the lesser of the msb from a 0 to a 1. The count at the end of a given frame may result in a 0 value for R representing that the light level for the respective photo sensor as amplified did not reach a corresponding light level for which AGC compensation would be initiated. The AGC action results in corresponding reductions of the future amplified output and provides AGC to prevent a potential overflow of the number of bits that can be held by counter 140 during a frame. In this example, the AGC action is triggered based on the lesser of the most significant bits held by the counter 140 changing from 0 to 1. The increasing reduction in amplifier gain provides a dynamic AGC action that is applied as the msb number values increase in the counter. Alternatively, AGC control can be based on: analog, instead of digital, control levels by generating an analog voltage based on msb, changes in values of capacitance, instead of resistance, used in the amplifier feedback loop, differing numbers of msb digits to initiate and control the AGC action, and various dynamic ranges may include non-linear AGC responses such as by non-linear amplifier gain control by non-linear steps/changes in feedback element. Should an amplifier/converter 115 not be required such as due to the use of a different type of photo sensor, AGC can still be implemented by varying the level of signal from the sensor such as by a selectable voltage divider that provides controllable levels of voltage reduction.

Figure 2:
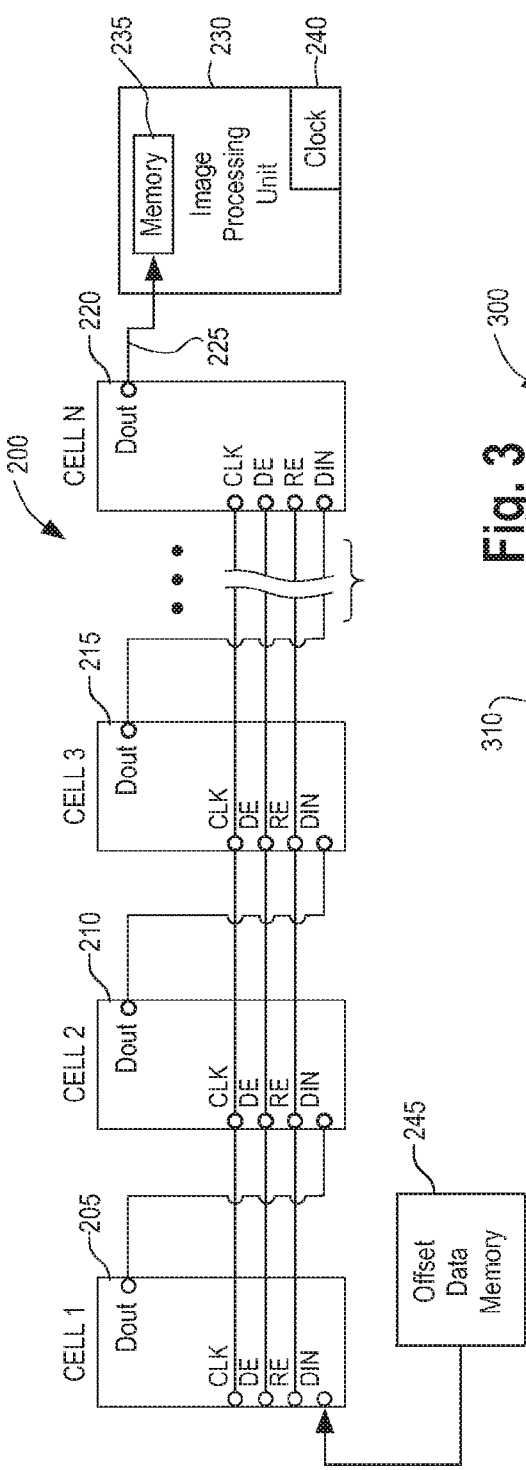
FIG. 2 is a diagram showing an exemplary interconnection of cells in an array.

FIG. 2 shows an array 200 of exemplary interconnected cells 205, 210, 215 and 220. Each of these cells may be similar as described with regard to FIG. 1. From an image output perspective, these cells are connected in series. That is, the digital output Dout representing the light sensed by the corresponding photo sensor of cell 205 is connected to the digital input Din of the next adjacent cell 210. Each of the N cells is connected in series so that the output Dout 225 of the N cell 220 represents the last cell in the series. For example, each of these serial cells may correspond with a different photo sensor in one row of an X by Y array of cells aligned in rows and columns. The binary number residing in the counter of each of the cells at the conclusion of an image frame is serially clocked from cell to cell so that the output 225 provides a serial input to memory 235 of the image processing unit 230. Therefore, at the conclusion of an image frame, memory 235 will contain the separate counter values associated with each of the N cells. Similarly, the N cells associated with each of the other rows in the array will also be conveyed at the end of an image frame to memory 235 (or other corresponding memory) so that the image processing unit 230 will have available a corresponding digital number representing the sensed information corresponding to each of the photo sensors in the array. The image processing unit 230 may apply various known image processing enhancements before rendering a final frame image, such as for display. In this example, clock 240 of the image processing unit 230 provides a master clock for each of the cells in the array. The image processing unit 230 may include a microprocessor, read-only memory, random-access memory and an input/output module for receiving and transmitting digital information with external elements.

The offset data memory 245 is coupled to the data input Din of the first cell in the series and may contain a digital value associated with each of the serially connected cells that is used for compensation to normalize the sensitivity of the different photo sensor's, e.g. neutralize so-called "dark current". Respective digital values may be serially clocked into each of the counters of the cells prior to the beginning of an image frame in order to neutralize dark current or other dissimilarities among the respective photo sensors. Although a second memory 245 is shown, the respective all set data could be stored in memory 235 if convenient. If this offset value is relatively constant, it could be stored individually in the respective cells and read into the respective counters at the beginning of an image frame. Known algorithms stored in the memory of image processing unit 230 may be utilized to control the clocking of the digital data from the cells into memory 235 and the clocking of the offset data into the counters of the respective cells to provide offset compensation.

Figure 3:
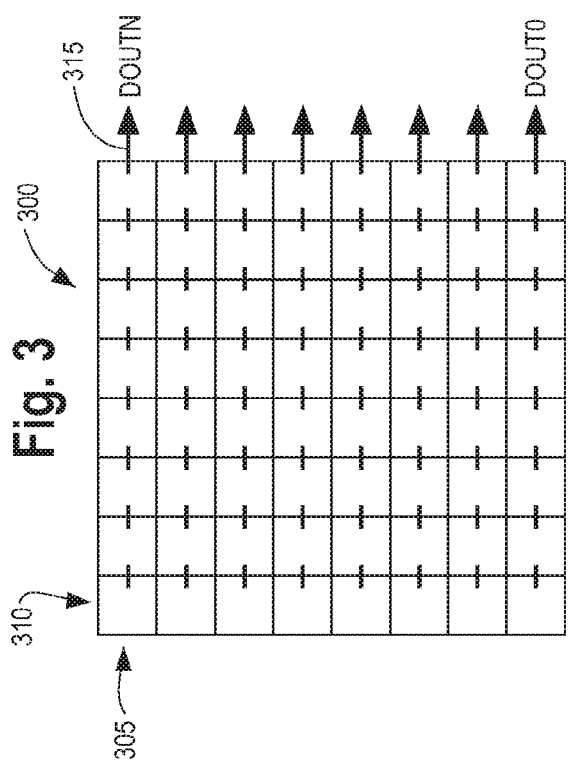
FIG. 3 depicts an exemplary X by Y array of cells.

FIG. 3 represents an exemplary X by Y array 300 of image capturing cells. This exemplary array contains 8 rows 305 and 8 columns 310 each consisting of a cell that includes a photo sensor. In this exemplary array configuration, 8 data outputs Dout 315 containing the sensed information associated with each of the cells in the respective rows is provided. In order to speed the clocking of the information from the respective counters, the outputs from the 8 respective rows may be clocked in parallel into memory 235 (or register) and stored for use by the image processing unit 230 in generating a final image output. Alternatively, if sufficient connections are available and the memory that receives the sensed information is capable, a parallel transfer from each cell of the counter value could be used to enhance the speed of operation. Or if speed of data transfer is not a concern for a particular application, all cells could be connected in series and the outputs from each cell clocked through a single output communication line to memory or register for further processing.

FIG. 4 is a block diagram of another exemplary embodiment 400 that is similar to the embodiment 100 of FIG. 1. The elements of embodiment 400 operate similarly as described above with regard to embodiment 100. Embodiment 400 provides a time to target or time-of-flight (TOF) mode. A light source, e.g. a laser, 405 outputs a pulse of light 407 directed towards a target. The initiation of the output of the pulse of light 407 is controlled by pulse control circuit 410. A light pulse 415 represents a return reflection of the pulse of light 407 from the target. Photo sensor 105 is utilized to sense the reflected pulse 415. An output 420 from pulse control 410 provides a signal coupled to line 182 which corresponds to a time-of-flight mode enable signal to the counter 140. This signal corresponds to the illustrated event signal 425 where a transition from a one to a zero corresponds to the initiation of the laser pulse. In this embodiment, the magnitude of the uniform noise source 130 is adjusted so that only the significant signal from the reflected pulse 415 will cause a change of state of the comparator 125 and hence produce an output on the Q output of latch 135. In this embodiment, the counter 140 as enabled by the zero signal on line 182, begins a consecutive count 430 of the number of clock cycles 435 occurring since the transmission of the pulse 407 by laser 405. Upon the return pulse 415 being sensed, the Q output from latch 135 changes state and provides a signal to the "up/down" input of counter 140. Unlike embodiment 100, in embodiment 400 this input to the "up/down" input of counter 140 is utilized to inhibit further counting by the counter and thus latch the count value of counter 140 to the number of clock cycles occurring between the transmission of light pulse 407 and the detection of the return pulse 415. The count value is proportional to the round trip time to and from the target since the frequency of the clock is a constant and is known. This allows a distance to the target to be calculated based on the time to the target (½ the round trip time) and the known velocity of the laser pulse. In this embodiment, a distance calculating unit, e.g. a microprocessing unit, calculates the distance to target by converting the value to round trip time based on the known frequency of the clock pulses, multiplying the round trip time times 0.5 to determine the time from the target to the sensor, and multiplying that times the stored, known speed of travel of the laser pulse to yield a distance (feet, miles, etc.).

Although exemplary implementations of the invention have been depicted and described in detail herein, it will be apparent to those skilled in the art that various modifications, additions, substitutions, and the like can be made without departing from the spirit of the invention. For example, the sensor may be a multi-mode sensor having several active mode unit sensors and several passive mode unit sensors. The scope of the invention is defined in the following claims.

The invention claimed is:

1. An electronic light processing cell comprising:
    a photo sensor unit provides an analog electrical output proportional to an amount of light impinging on the photo sensor;
    a noise source provides a noise output;
    a comparator compares, during a plurality of times during a frame of an image, the analog electrical output and the noise output and provides a binary digital output representative of each comparison;
    a digital counter counts the binary digital outputs during the frame and stores a count at the end of a frame where the value of the stored count is proportional the light impinging the photo sensor, the value of the stored count adapted for use by an image processing unit to render an image based on a plurality of such values representing different locations within the frame.

2. The electronic light processing cell of claim 1 further comprising a clock generator that provides a plurality of clock outputs during each frame and a digital latch that holds the binary digital output at a given state between clock outputs.

3. The electronic light processing cell of claim 1 further comprising an automatic gain control (AGC) circuit that changes the level of the analog electrical output based on the value of the stored count reaching a predetermined value to reduce the rate at which the value of the counter increases.

4. The electronic light processing cell of claim 3 wherein the photo sensor unit comprises an amplifier having as its output the analog electrical output, the AGC circuit reduces an amplification factor of the amplifier reducing the magnitude of the analog electrical output and hence reducing the rate at which the counter is incremented.

5. The electronic light processing cell of claim 2 wherein the number of clock outputs during a frame is greater than 4096 in order to sufficiently oversample the binary digital output so that the count held by the counter at the end of each frame represents a value that is proportional to the magnitude of light impinging the photo sensor during the frame.

6. A method for generating a digital value that is proportional the magnitude of light impinging a photo sensor during a frame of an image, the method comprising the steps of:
    generating an analog electrical output proportional to an amount of light impinging on the photo sensor;
    generating a noise output;
    comparing a plurality of times during each frame the analog electrical output and the noise output and generating a binary digital output representative of each comparison;
    counting the binary digital outputs during each frame and storing a count at the end of a frame where the value of the stored count is proportional the light impinging the photo sensor, the value of the stored count adapted for use by an image processing unit to render an image.

7. The method of claim 6 further comprising generating a plurality of clock outputs during each frame and using a digital latch to hold the binary digital output at a given state between clock outputs.

8. The method of claim 6 further comprising providing automatic gain control (AGC) that changes the level of the analog electrical output based on the value of the stored count reaching a predetermined value to reduce the rate at which the value of the counter increases.

9. The method of claim 8 further comprising using an amplifier having as its output the analog electrical output, the AGC reducing an amplification factor of the amplifier to reduce the magnitude of the analog electrical output and hence reduce the rate of counts.

10. The method of claim 7 wherein the number of clock outputs during a frame is greater than 4096 and sufficiently oversamples the binary digital output so that the count at the end of each frame represents a value that is proportional to the magnitude of light impinging the photo sensor during the frame.

11. An electronic device comprising:
    a light generation source that outputs a pulse of light;
    a photo sensor unit provides an analog electrical output proportional to an amount of light impinging on the photo sensor;
    a noise source provides a noise output;
    a comparator compares the analog electrical output and the noise output and provides a binary digital output representative of the photo sensor unit sensing a reflected light pulse corresponding to a reflection of the pulse of light from a target;
    a clock outputs a series of clock signals having a predetermined frequency;
    a digital counter, coupled to the clock and comparator, counts a number of clock signals occurring during a frame where a frame is defined between the generation of one pulse of light and the binary digital output from the comparator, the value of the number being proportional to the time required for the reflected light pulse from the target to reach the photo sensor unit.

12. The electronic device of claim 11 further comprising a distance conversion apparatus that converts the value to a distance of the target from the photo sensor unit based on a known speed of travel of the reflected light pulse and the time required for the reflected light pulse to reach the photo sensor unit.

13. The electronic device of claim 12 wherein the predetermined frequency of the clock signals during a frame is greater than 4096 in order to enhance precision of the determined distance.

14. A method for determining a distance to a target comprising the steps of:
    generating a pulse of light;
    generating an analog electrical output proportional to light impinging on a photo sensor;
    generating a noise output;
    comparing the analog electrical output and the noise output and providing a binary digital output representative of the photo sensor unit sensing a reflected light pulse corresponding to a reflection of the pulse of light from the target;

generating a series of clock signals having a predetermined frequency;

counting a number of clock signals occurring during a frame where a frame is defined between the generation of one pulse of light and the binary digital output from the comparator, the value of the number being proportional to the time required for the reflected light pulse from the target to reach the photo sensor unit;

converting the value into a distance of the target from the photo sensor based on a known speed of travel of the reflected light pulse and the time required for the reflected light pulse to reach the photo sensor based on the value and predetermined frequency.

15. The method of claim 14 wherein the predetermined frequency of the clock signals during a frame is greater than 4096 in order to enhance precision of the determined distance.

\* \* \* \* \*